(12) United States Patent
Splithof

(10) Patent No.: US 9,998,079 B2
(45) Date of Patent: Jun. 12, 2018

(54) AMPLIFIERS

(71) Applicant: NXP B.V., Eindhoven (NL)

(72) Inventor: Mike Splithof, Silvolde (NL)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/485,384

(22) Filed: Apr. 12, 2017

(65) Prior Publication Data

US 2017/0310290 A1    Oct. 26, 2017

(30) Foreign Application Priority Data

Apr. 22, 2016   (EP) .................................... 16166615

(51) Int. Cl.
| | |
|---|---|
| H03F 3/393 | (2006.01) |
| H03F 3/185 | (2006.01) |
| H04R 1/02 | (2006.01) |
| H04R 3/04 | (2006.01) |
| H03F 1/26 | (2006.01) |
| H03F 3/187 | (2006.01) |
| H03F 3/45 | (2006.01) |

(52) U.S. Cl.
CPC .............. *H03F 3/393* (2013.01); *H03F 1/26* (2013.01); *H03F 3/185* (2013.01); *H03F 3/187* (2013.01); *H03F 3/4565* (2013.01); *H03F 3/45179* (2013.01); *H03F 3/45475* (2013.01); *H04R 1/028* (2013.01); *H04R 3/04* (2013.01); *H03F 2200/03* (2013.01); *H03F 2200/165* (2013.01); *H03F 2200/171* (2013.01); *H03F 2200/301* (2013.01); *H03F 2200/372* (2013.01); *H03F 2200/375* (2013.01); *H03F 2200/72* (2013.01); *H03F 2203/45008* (2013.01);

(Continued)

(58) Field of Classification Search
CPC .................................................. H03F 3/45892
USPC ...................................... 330/9; 327/124, 307
See application file for complete search history.

(56) References Cited

U.S. PATENT DOCUMENTS

| | | | | |
|---|---|---|---|---|
| 4,048,574 A | * | 9/1977 | Barbier ..................... | H03F 3/38 330/253 |
| 7,385,443 B1 | * | 6/2008 | Denison .................... | H03F 3/38 330/10 |

(Continued)

FOREIGN PATENT DOCUMENTS

| | | |
|---|---|---|
| CN | 103105508 A | 5/2013 |
| EP | 1 548 932 A1 | 6/2005 |
| EP | 2 996 352 A1 | 3/2016 |

OTHER PUBLICATIONS

Enz, Christian C. et al; "Circuit Techniques for Reducing the Effects of Op-Amp Imperfections: Autozeroing, Correlated Double Sampling, and Chopper Stabilization"; IEEE Proceedings, vol. 84, No. 11; pp. 1584-1614 (Nov. 1996).

(Continued)

*Primary Examiner* — Henry Choe

(57) ABSTRACT

A chopper amplifier and method of operation are described. The chopper amplifier comprises a first chopper arranged to modulate an input signal using a first chopper signal having a chopper frequency. An amplification stage has an input arranged to receive the chopped signal and an output, and supplies an amplified signal at the output. An output chopper is arranged to integrate the amplified signal using a second chopper signal having the chopper frequency to generate an amplified output signal. The amplification stage is further configured to filter the chopped signal to attenuate signal components having frequencies lower than the chopper frequency.

14 Claims, 4 Drawing Sheets

(52) U.S. Cl.
CPC ............ *H03F 2203/45074* (2013.01); *H03F 2203/45088* (2013.01); *H03F 2203/45134* (2013.01); *H03F 2203/45136* (2013.01); *H03F 2203/45138* (2013.01); *H03F 2203/45178* (2013.01); *H03F 2203/45201* (2013.01); *H03F 2203/45212* (2013.01); *H03F 2203/45394* (2013.01); *H03F 2203/45418* (2013.01); *H03F 2203/45424* (2013.01); *H03F 2203/45434* (2013.01); *H03F 2203/45638* (2013.01); *H03F 2203/45682* (2013.01); *H03F 2203/45702* (2013.01); *H03F 2203/45714* (2013.01); *H04R 2499/11* (2013.01)

(56) References Cited

U.S. PATENT DOCUMENTS

| | | | |
|---|---|---|---|
| 7,518,443 B2* | 4/2009 | Matthews | H03F 1/26 330/10 |
| 7,595,648 B2* | 9/2009 | Ungaretti | G01P 15/125 324/676 |
| 7,671,672 B2* | 3/2010 | McConnell | H03F 1/26 327/124 |
| 7,795,960 B2* | 9/2010 | Lyden | H03F 3/387 330/9 |
| 2008/0111621 A1 | 5/2008 | Matthews | |
| 2009/0115522 A1 | 5/2009 | Lynden et al. | |
| 2013/0287084 A1 | 10/2013 | Bankman et al. | |
| 2017/0085233 A1 | 3/2017 | Berkhout et al. | |

OTHER PUBLICATIONS

Wang, Ziqiang et al; "A chopper current feedback instrument amplifier with bandpass amplification stage"; Analog Integr circ Sig Process, vol. 81; pp. 763-775 (2014).

Yates, David C. et al; "An Ultra Low Power Low Noise Chopper Amplifier for Wireless EEG"; 49th IEEE International Midwest Symposium on Circuits and Systems, vol. 2; pp. 449-452 (2006).

* cited by examiner

AMPLIFIERS

CROSS-REFERENCE TO RELATED APPLICATIONS

This application claims the priority under 35 U.S.C. § 119 of European patent application no. 16166615.1, filed Apr. 22, 2016 the contents of which are incorporated by reference herein.

The present specification relates to amplifiers and, and in particular to chopper amplifiers and methods of operation of chopper amplifiers.

Electronic amplifiers are used to increase the strength of an input signal which may be a DC signal or an AC signal.

In some applications, the input signal can be quite small and a high gain may be needed in order to increase the strength of the output signal to desired level. The design of high gain DC amplifiers can be challenging, especially when the input offset voltage and 1/f noise need to be taken into account. Generally speaking the input offset voltage is the difference in voltage between a first and a second input to a differential amplifier which is needed in order to produce a zero output. This is largely owing to inherent differences in the components used to build the amplifier, such as transistors. The input offset voltage is a DC voltage and 1/f; or flicker noise, has a larger spectral component at lower frequencies, and so DC amplifiers with high gain can have significant unwanted signal components in their output signal arising from the offset voltage and/or 1/f noise.

AC amplifiers which can better deal with the offset voltage and/or 1/f noise are easier to build.

A chopper amplifier may be used as a DC amplifier and uses a chopper signal to modulate the input signal so that it can be amplified as if it were an AC signal and then integrates the output of the amplifier back to a DC signal at its output. This approach allows small DC signals to be amplified.

The output of the chopper amplifier can also be passed through an output filter to try and remove unwanted signals. However, for very small input signals, the design of an output filter which has a filter characteristic sufficient to remove unwanted signals and retain the amplified output signal can be difficult, particularly in solid state or integrated circuit implementations.

Hence, amplifiers and methods of amplification which are capable of amplifying small, lower frequency signals would be generally beneficial.

According to a first aspect of the present disclosure, there is provided a chopper amplifier, comprising: a first chopper arranged to modulate an input signal using a first chopper signal having a chopper frequency and to output a chopped signal; an amplification stage having an input arranged to receive the chopped signal and an output, wherein the amplification stage is configured to supply an amplified signal at the output; and an output chopper arranged to integrate the amplified signal using a second chopper signal having the chopper frequency to generate an amplified output signal, wherein the amplification stage is further configured to filter the signal passing through the amplification stage to attenuate signal components having frequencies lower than the chopper frequency.

In one or more embodiments, the amplification stage may have a high pass filter behaviour.

In one or more embodiments, the amplification stage may have a band pass filter behaviour.

In one or more embodiments, the amplification stage may be further configured to filter the chopped signal to reduce offset and/or 1/f noise signal components.

In one or more embodiments, the input signal may have a voltage less than about 50 mV, 20 mV or 10 mV.

In one or more embodiments, the input signal may have a voltage in the range of approximately 10 µV to 10 mV.

In one or more embodiments, the amplification stage may include a main amplifier.

In one or more embodiments, the amplification stage may include a filter, or filtering circuitry, at an input to the main amplifier or a filter, or filtering circuitry, at an output of the main amplifier.

In one or more embodiments, the main amplifier may have a differential voltage input and/or a differential voltage output. An inductive circuit or component may be connected across the differential voltage output.

In one or more embodiments, the main amplifier may comprise a cascade of a voltage-to-current converter and a current-to-voltage converter.

In one or more embodiments, the voltage-to-current converter may be provided by a pair of transistors arranged with a common gate topology, and/or the current-to-voltage converter may be provided by a pair of resistors.

In one or more embodiments, the inductive circuit may be provided by a pair of negative feedback amplifiers.

In one or more embodiments, the amplification stage may further comprise a differential mode amplifier connected to the main amplifier and arranged to govern the common mode rejection performance of the amplification stage.

In one or more embodiments, the amplification stage may further comprise a common mode loop amplifier connected to the main amplifier and arranged to define the common mode output voltage of the main amplifier.

According to a second aspect of the present disclosure, there is provided a chopper amplifier system, comprising: the chopper amplifier of the first aspect; and a filter arranged to filter the amplified output signal generated by the second chopper.

In one or more embodiments, the filter may be a low pass filter.

According to a third aspect of the present disclosure, there is provided a package including a semi-conductor integrated circuit, wherein the semi-conductor integrated circuit is configured to provide the chopper amplifier of the first aspect or the chopper amplifier system of the second aspect.

According to a fourth aspect of the present disclosure, there is provided a portable electronic device, comprising: the chopper amplifier system of the second aspect; and a loud speaker, and wherein the chopper amplifier system is arranged to receive the input signal from the loud speaker.

In one or more embodiments, the portable electronic device may be configured to operate the loud speaker also as a microphone.

In one or more embodiments, the portable electronic device may be a wireless communications device. The wireless communications device may be a mobile phone.

According to a fifth aspect of the present disclosure, there is provided a method of amplifying a signal, comprising: modulating an input signal using a first chopper signal having a chopper frequency to generate a chopped signal; filtering and amplifying the chopped signal to attenuate signal components having frequencies lower than the chopper frequency in an amplified signal; and integrating the amplified signal using a second chopper signal having the chopper frequency to generate an amplified output signal.

Features of the first or second aspects may also be counterpart features for the fifth aspect.

BRIEF DESCRIPTION OF DRAWINGS

Example embodiments of the invention will now be described in detail, by way of example only, and with reference to the accompanying drawings, in which.

Similar items in the different Figures share like reference signs unless indicated otherwise.

Example chopper amplifiers and chopper amplifier systems will be described below within the context of use in a mobile phone, but it will be appreciated that the chopper amplifiers and chopper amplifier systems may be used in a wide variety of electronic devices, apparatus, appliances and systems. The chopper amplifiers and chopper amplifier systems may be used in any application in which is desirable to be able to amplify small voltages, for example in the range of approximately a few μV to tens of mV.

The chopper amplifiers and chopper amplifier systems may be used with a wide range of sensors or transducers that have small signal outputs.

By way of non-limiting example, such sensors may include various magnetic sensors. Non-limiting examples of magnetic sensors include automotive magnetic sensors, such as angular sensors and anti-lock braking sensors.

Figure 1:
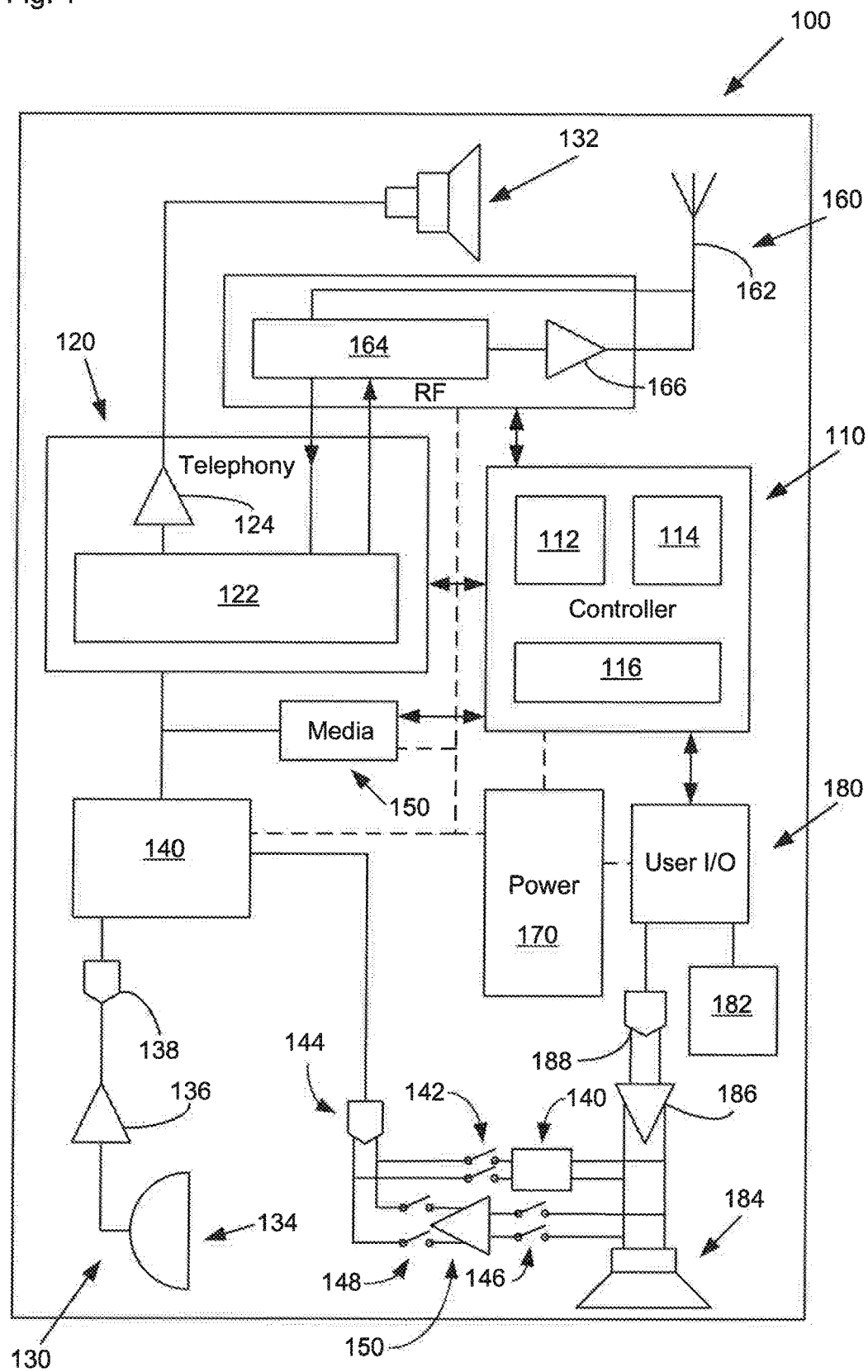
FIG. 1 shows a schematic block diagram of an example electronic device in which an example chopper amplifier system may be used.

With reference to FIG. 1, there is shown a schematic block diagram of an electronic device 100 in the form of a mobile or cellular phone, being merely one example of a portable electronic device, FIG. 1 is schematic and illustrates the major functional items typically present in a mobile phone. Other common features are omitted from FIG. 1 so as not to obscure the description, but are well known by a person of ordinary skill in the art. Further, the blocks shown in FIG. 1 are largely arranged by functionality and it will be appreciated that in practice the functions provided by the various blocks may be physically arranged in other ways and/or distributed amongst other blocks or components, and may be implemented by different arrangements of specific electronic circuits, components or devices.

The mobile phone 100 includes a controller subsystem 110 which provides high level control of the overall operation of the mobile phone and also interacts with the other subsystems to issue and receive command signals and data signals. For example the controller subsystem may include a microcontroller, 112, a digital signal processor 114 and memory 116, which may include RAM, ROM, EEPROM and other forms of electronic storage. The mobile phone 100 also includes a first audio subsystem in the form of a telephony subsystem 120, which handles much of the audio signal processing used to make a telephone call, a second audio subsystem in the form of a media subsystem 150, an RF subsystem 160, a power subsystem 170, and a user input/output subsystem 180. The mobile phone also includes an audio processing system or circuitry 130 which may include a chopper amplifier system 150 used to amplify signals from a loud speaker 184 when operating as a microphone.

The RF subsystem includes an antenna 162 for wirelessly sending and receiving RF electromagnetic signals which encode transmitted and received voice signals, an RF transceiver 164, which may include modulator, synthesizer and receiver parts, and a power amplifier 166 which amplifies the power of the signal to drive the antenna 162. The modulator of the RF transceiver can receive an outgoing voice signal from an RF interface part of the telephony circuit 120 for encoding prior to transmission and the receiver part of the RF transceiver can decode a received RF signal to generate an incoming voice signal which is passed to the RF interface of the telephony subsystem 120.

The power subsystem 170 includes a power supply, handles power management and supplies electrical power to all the other parts or subsystems of the mobile phone as schematically illustrated by various dashed lines in FIG. 1.

The user input/output subsystem 180 provides an interface between various user input and output devices, which may include, for example, one or more of a touch screen 182, a keyboard (not shown), buttons and or switches (also not shown). The user I/O system 180 also includes a loud speaker 184 with terminals connected via to an audio amplifier 186, whose input is connected to a digital to analog converter 188, which receives digital signals from the user I/O system 180. In normal use, the loud speaker 184 provides various types of audio output which is broadcast so that a user can generally hear it, such as audio media playback, alerts or other audible signals, or an incoming call voice if the mobile phone is being used in a speakerphone mode.

The media subsystem 150 provides a further audio subsystem and handles the processing of various media items, such as sound files, image files and/or video files. Images may be displayed on the screen 182 and media items having audio content may be played back using loud speaker 184. Media subsystem 150 may include one or more cameras and/or video cameras (not shown) for capturing images. Media subsystem may also provide various media play back functionalities, such as a video player and a voice recording and playback functionality.

The mobile phone also includes an earpiece speaker 132 and one or more microphones, represented by microphone symbol 134 which acts as transducers. The earpiece speaker 132 converts an electrical signal output from the telephony subsystem 120 into an output acoustic signal and the microphone or microphones 134 convert acoustic signal into one or more electrical signals as an input to the audio processing subsystem 130. The electrical signal from the microphone 134 can includes various components including a desired acoustic signal, such as a voice signal component corresponding to the user's voice during telephony or speech or music acoustic components when recording video.

The output from the microphone is supplied to an amplifier 136 whose output is passed through an analogue to digital converter 138 whose output digital signal may be passed as a first input to a first signal processing block 140. The output of the first signal processing block 140 is a processed audio signal and is then passed to one or more of the audio subsystems. For example, the processed audio signal can be passed to a second signal processing block 122, of the telephony subsystem 120, which may be digital or analogue or a combination thereof. The second signal processing block 122 includes logic, or is otherwise configured or arranged, to implement any conventional processing of audio signals including voice content for telephony, such as one or more codecs to encode the voice signal for transmission or decode received voice signals for output. The encoded voice signal for transmission is then passed to the RF subsystem 160 by a first output of the second signal processing block 122 acting as part of an RF interface to the modulator of the RF transceiver 164 for transmission.

A second output of the second processing block 122 is supplied via an audio amplifier 124 to supply an amplified output signal to drive the earpiece speaker 122 (and also optionally to an earpiece connector or socket if provided). An incoming call signal is received by the antenna 162, demodulated by the receiver of the RF transceiver 164, passed by the RF subsystem 160 to the RF interface of the telephony processing block 122 and any conventional signal processing of the incoming call signal is carried out, such as decoding the incoming call signal.

The audio processing system 130 also allows the loud speaker 184 to be used as a microphone, when not being used as a speaker. Sensing circuitry 140 is connected to the lines from amplifier 186 which are used to drive the loud speaker 184. The output of the sensing circuitry 140 is connected by a first controllable switch 142 to an analog to digital converter 144 whose digital output signal is supplied to the first signal processing block. The sensing circuitry 140 can be used to determine when the audio amplifier 186 is driving the loud speaker and when it is not. The terminals or contacts of the loud speaker 184 are also connected by a second controllable switch 146 to the input of a chopper amplifier system 150, the output of which is supplied via a third controllable switch 148, via the analog to digital converter 144 to the first signal processing block 140.

When the sensing circuit 140 detects that the audio amplifier 186 is being used to drive the loudspeaker 184, then the first signal processing block 140 controls first switch 142 to be closed and controls second and third switches 146 and 148 to be open so as to isolate the chopper amplifier system 150 from the relatively large voltage drive signals applied to the loud speaker 184. When the sensing circuit 140 detects that the audio amplifier 186 is not being used to drive the loudspeaker 184, and when any other part of the system determines that audio output is not currently being generated, then the first signal processing block 140 controls first switch 142 to be open and controls second and third switches 146 and 148 to be closed. In this configuration, the loud speaker 184 can be used as a microphone. The relatively small voltages generated by the loud speaker when acting as a microphone, for example typically about 10 µV-10 mV, are supplied to the chopper amplifier system 150, amplified and filtered, as described in greater detail below, and then the analog output is supplied to the analog to digital converter 144 for further processing and handling of the digital audio signal by the rest of the system.

Figure 2:
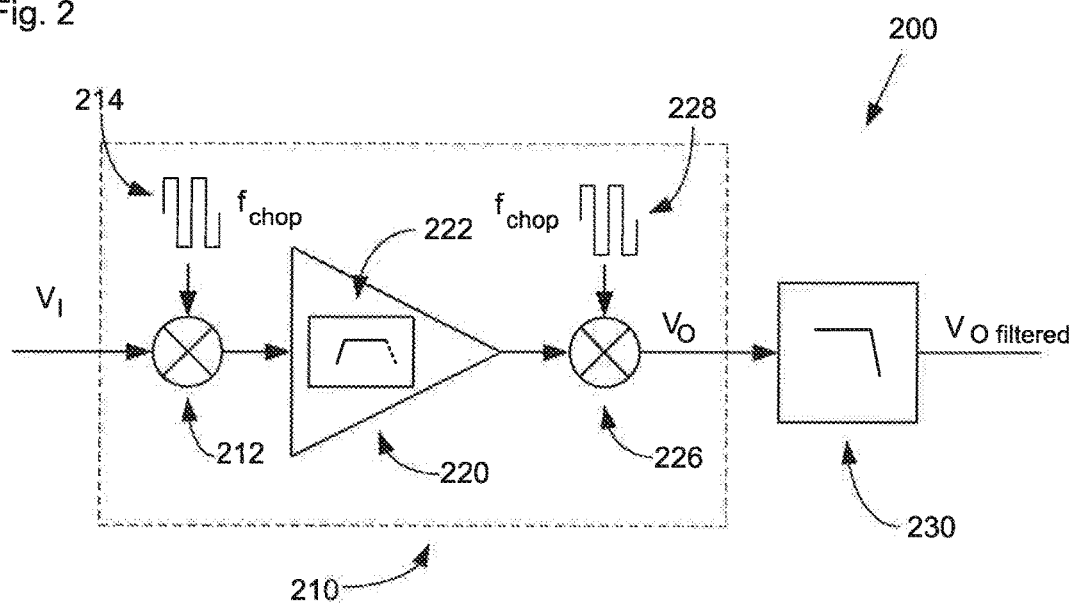
FIG. 2 shows a schematic block diagram of an example chopper amplifier system.

With reference to FIG. 2 there is shown a chopper amplifier system 200 corresponding generally to part 150 of FIG. 1. The chopper amplifier system 200 includes a chopper amplifier 210 and a filter 230 attached to receive the output of the chopper amplifier. The chopper amplifier receives at its input an input DC voltage, $V_I$, and outputs an amplified output DC voltage, $V_O$, which in turn is filtered by filter 230 to result in a filtered amplified DC voltage, $V_{O\ filtered}$.

The chopper amplifier 210 includes a first, input chopper 212 which multiplies the input voltage with a square wave chopper signal 214 having a chopper frequency, $f_{chop}$. This modulates the input signal to higher frequencies. The chopper amplifier 210 also includes an amplification stage 220.

As schematically illustrated in FIG. 2, the amplification stage operates to both amplify and filter its input signal. The amplification stage may first filter the input signal and then amplify the filtered signal. Alternatively, the input signal may be amplified and then the amplified signal filtered. An example of an amplification stage which filters and then amplifies would be an AC coupled amplifier. Such amplifiers are particularly suitable for non-integrated circuit implementations as the may use large coupling capacitors to provide the AC coupling. Hence, such amplification stages are arranged with a filter or filtering circuitry connected to the input of the main amplifier of the amplification stage.

In FIGS. 3 to 6 an amplification stage which amplifies and then filters is described which is more suitable for implementation as an integrated circuit. In these arrangements a filter or filtering circuitry is attached to an output of the main amplifier. However, it will be understood that the chopper amplifier is not limited to the approach of amplify then filtering.

As schematically illustrated in FIG. 2, the amplification stage is configured to attenuate, or otherwise reduce, at least the lower frequency components of the signal and also amplify the signal. Hence, as illustrated in FIG. 2, the amplification stage 220 has at least a high pass transfer function, or alternatively a band pass transfer function. The transfer function of the amplification stage attenuates or filters out components of the amplified signal having frequencies lower than the chopper frequency and all the way down to DC. The amplification behaviour of the amplification stage 220 will include low and zero frequency imperfections, such as noise, including if noise, and the offset voltage. However, the high pass or band pass transfer function 222 of the amplification stage reduces the presence of signal components at those lower frequencies in the amplified signal output by the amplification stage 220.

The chopper amplifier 210 also includes a second, output chopper 226 which multiplies the output of the amplification stage with a square wave chopper signal 228 having the same chopper frequency, $f_{chop}$, as the input chopper 212. This de-modulates or integrates the amplified signal back into a DC or baseband signal.

The amplified signal output by the amplification stage $V_O$, may then be filtered by low pass filter 230 to remove higher frequency signals, as described in greater detail below.

The de-chopping operation causes disturbances in the spectrum of the output signal, $V_O$. Spectral components around are generates at the even harmonics of the chopper signal ($2 \times f_{chop}$, $4 \times f_{chop}$, etc.) These are due to the limited bandwidth of the amplification stage between the choppers. Typically, the amplitudes of these even harmonics are much lower than the signal. De-chopping also generates spectral components around the odd harmonics of the chopper signal ($1 \times f_{chop}$, $4 \times f_{chop}$, etc.).

In the absence of the high pass or pass band transfer function, then these would include significant spectral images of the modulated offset voltage and 1/f noise around $f_{chop}$. This can be especially significant when the offset voltage of the amplifier is large, in which case the amplitude of these harmonics would be relatively large.

To avoid overloading the next stage of the circuit in which the chopper amplifier system 210 is being used, for example an A/D converter with a limited dynamic range and which is optimized for the signal to be converted, then low-pass filtering may be required to reduce the amplitudes of these higher frequency harmonics. This will finally result in the filtered output signal $V_{O\ filtered}$.

Continuing the discussion in the absence of the high pass or band pass transfer function of the amplification stage, to attenuate the unwanted higher frequency spectral components using only a low-pass filter at the output of the de-chopper 226, the following parameters would play a role in the design of that filter:

(i) the maximum signal frequency of the base band signal ($V_I$) will define the passband of the filter;

(ii) the chopper frequency ($f_{chop}$) will define the stopband frequency of the filter; and (iii) the required amount of attenuation of the spectral components around the chopper frequency will be defined by the dynamic range of the stage that will receive signal $V_{O\ filtered}$.

The ratio between the stopband frequency and passband frequency will be the transition band of the filter. Together with the required amount of attenuation in the stopband, the transition band will define the slope of the filter. The slope of an analogue filter is characterised by its order. First order filters will have a fixed slope of −20 dB/decade. Depending on the requirements, the order of the filter may need to be increased, but this will increase circuit complexity and/or increase power consumption and/or increase chip area in integrated circuit implementations.

Instead of using only a low-pass filter operating on the output of the de-chopper 226, the chopper amplifier 210, includes a high-pass or band-pass filter operating on amplified signal, prior to de-chopping. The amplification stage 220 includes a high-pass or band-pass behaviour 222, such that the modulated signals generated by de-chopper 226 have a higher frequency than the corner frequency of the output filter 230. Hence, the target signals of interest are amplified by the required gain whereas lower frequency and DC imperfections, like offset and 1/f noise, are amplified less or are not amplified at all. Consequently less attenuation is required by the low pass filter 230 at the output, thereby relaxing the specifications for the output low-pass filter 230.

Using this approach, the main filtering operation occurs between the choppers 212 and 226, and the target signals are modulated around the chopper frequency (and its odd multiples) and the components that have to be attenuated are around DC (the offset voltage and larger proportion of 1/f noise). Also, the ratio between the frequencies of the wanted signals (around $f_{chop}$) and the frequencies of the disturbances is much higher than before (because the offset is at 0 Hz). Therefore, the transition band of the high-pass, or band pass, filter 222 of the amplification stage is much wider, than in the absence of the filtering behaviour of the amplification stage, and if a low-pass filter alone were used after the output de-chopper. Hence, less power and/or less chip area may be needed to implement the required high-pass, or band pass, filter characteristic of the amplification stage.

In some applications, the output filter 230 may be omitted. In other applications, in which higher frequency unwanted signals may still be present, then output filter 230 may be used. For example, the low pass output filter 230 may be provided to filter out signals at the even harmonics of the chopping frequency, $2\times f_{chop}$, $4\times f_{chop}$, etc., which are a side effect of filtering between the choppers 212, 226. However, these unwanted signals are a factor of two higher than $f_{chop}$, and also will have a much smaller amplitude compared to the situation without filtering between the choppers, owing to the attenuation of the lower frequency components by the amplification stage 220.

Hence, the amplification stage 220 between the choppers has low gain for lower frequencies (offset and 1/f noise) and the intended gain for signal frequencies around the chopper frequency. Adding a band pass or high pass transfer behaviour to the amplifier of a chopper amplifier, avoids or reduces amplification of offset, 1/f noise and other lower frequency imperfections. Therefore, any output filter does not have to filter out these contributions anymore. This relaxes the requirements on the output filter which may be simpler and more efficiently implemented.

Figure 3:
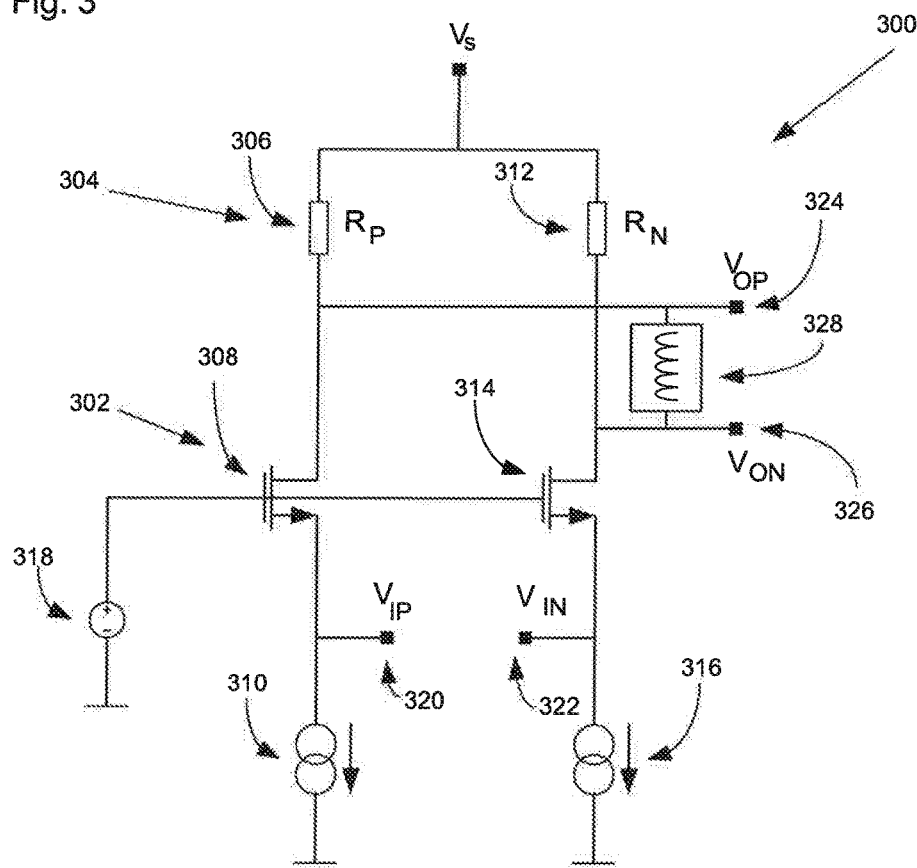
FIG. 3 shows a circuit diagram of a first example amplification stage which may be used in the chopper system shown in FIG. 2.

FIG. 3 shows a circuit diagram of an amplification stage 300 with a band-pass behaviour and corresponding generally to amplification stage 220 of FIG. 2. As discussed above, a particular application for chopper amplification system 210 is as a microphone amplifier, and particularly an amplifier for a loud speaker of a mobile phone when used as a microphone. This application is characterized by very low signal amplitudes, typically one or two orders of magnitude below typical CMOS offset voltages and so typically around approximately 0.2 mV-1 mV.

The band-pass amplifier 300 has the generally topology of a cascade of a voltage-to-current (V-I) converter 302 and a current-to-voltage (I-V) converter 304. A first limb of circuit 300 is connected to a supply voltage, $V_s$, and includes a first resistor $R_P$ 306 connected in series with a first transistor 308 connected to local wound or chassis by a first constant current source 310. A second limb of circuit 300 is similarly connected to a supply voltage, $V_s$, and includes a second resistor $R_N$ 312 connected in series with a second transistor 314 connected to local pound or chassis by a second constant current source 316. The subscripts P and N denote positive and negative and indicate the polarity of the differential signals. The first and second transistors are arranged in a common-gate topology with their gates each connected to a voltage supply 318 which supplies a common mode signal. Transistors 308 and 314 may be N-type or P-type devices and may be of any suitable technology that exhibits amplification, such as CMOS, bipolar, etc.

Input voltage terminals $V_{IP}$ 320, $V_{IN}$ 322 and output voltage terminals $V_{OP}$ 324, $V_{ON}$ 326 are connected to the first and second limbs respectively and provide an input node and an output node respectively for the band-pass amplifier 300.

A circuit element or circuit 328 having an inductive behaviour is attached to the output node by being attached across the output terminals.

The operation of the band-pass amplifier 300 is generally as follows. The differential input voltage $V_{IP}$-$V_{IN}$ is converted into a differential current via the transconductances of transistors 308 and 314. The differential currents are conveyed to the resistors $R_P$ 306 and $R_N$ 312, which convert the differential current into a differential output voltage $V_{OP}$-$V_{ON}$.

In the absence of inductive element 328, the amplifier would have a low-pass behaviour with a wide bandwidth depending on circuit parasites. To avoid the offset and 1/f signals experiencing the same amplification as the intended signals (which have frequencies around the chopper frequency), the amplifier 300 is configured as a band-pass amplifier by placing a component or circuit 328 which exhibits inductive behaviour between $V_{OP}$ and $V_{ON}$. At low frequencies the component or circuit forms a short circuit and at higher frequencies it presents a high-impedance, thereby achieving the intended band-pass behaviour for amplifier 300.

For RF technology applications, the inductive component or circuit 328 may simply be an inductor. For lower frequency applications an inductive behaviour circuit may be utilised in an integrated circuit implementation to provide the level of inductance needed.

To overcome implementation issues at lower frequency, for an integrated circuit implementation of circuit 300, instead of using an inductor as the inductive component or element 328, an active circuit with a similar behaviour can be used. For example, an amplifier with negative feedback may be used and this is illustrated in FIG. 4.

Figure 4:
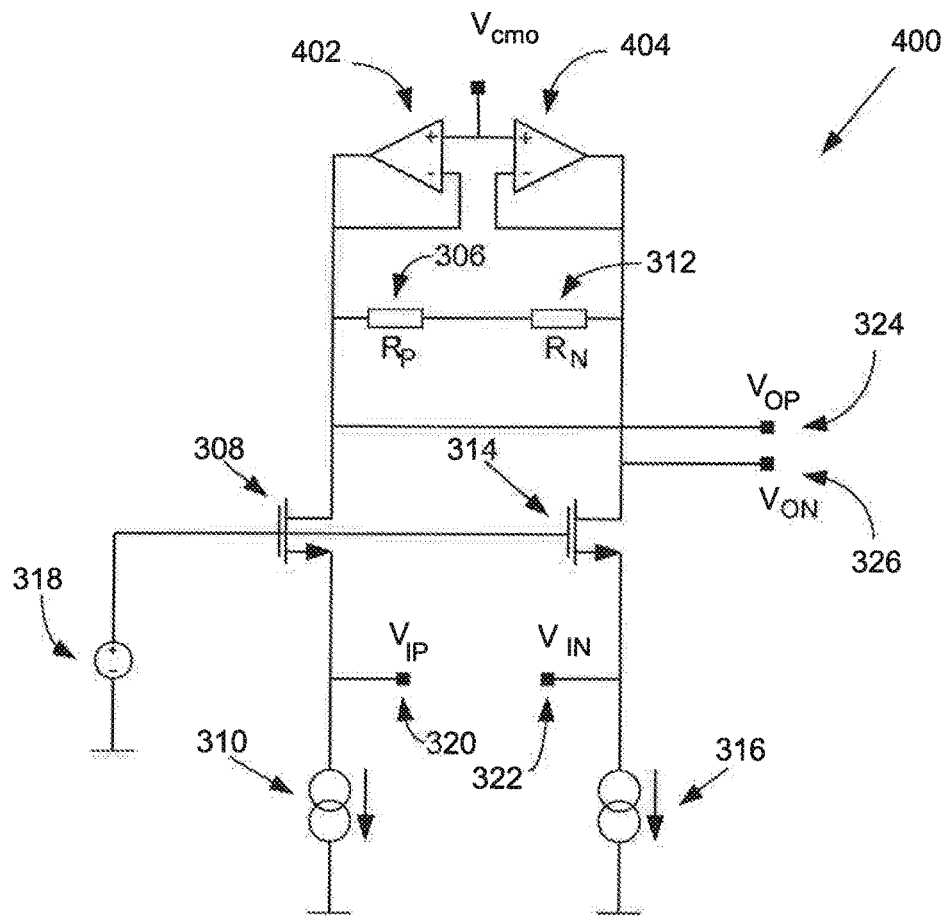
FIG. 4 shows a circuit diagram of a second example amplification stage which may be used in the chopper system shown in FIG. 2.

FIG. 4 shows a second band-pass amplifier circuit 400 corresponding generally to amplification stage 220 of FIG. 2. The components and overall layout of circuit 400 are similar to those of circuit 300, other than in how the inductive circuitry is incorporated. The inductive behaviour in circuit 400 is provided by a pair of single ended negative feedback amplifiers 402, 404 whose non-inverting inputs are each connected to a common mode supply voltage, $V_{CMO}$. The value of $V_{CMO}$ can be used to set the common mode output voltage of $V_{OP}$ 324 and $V_{ON}$ 326.

Figure 5:
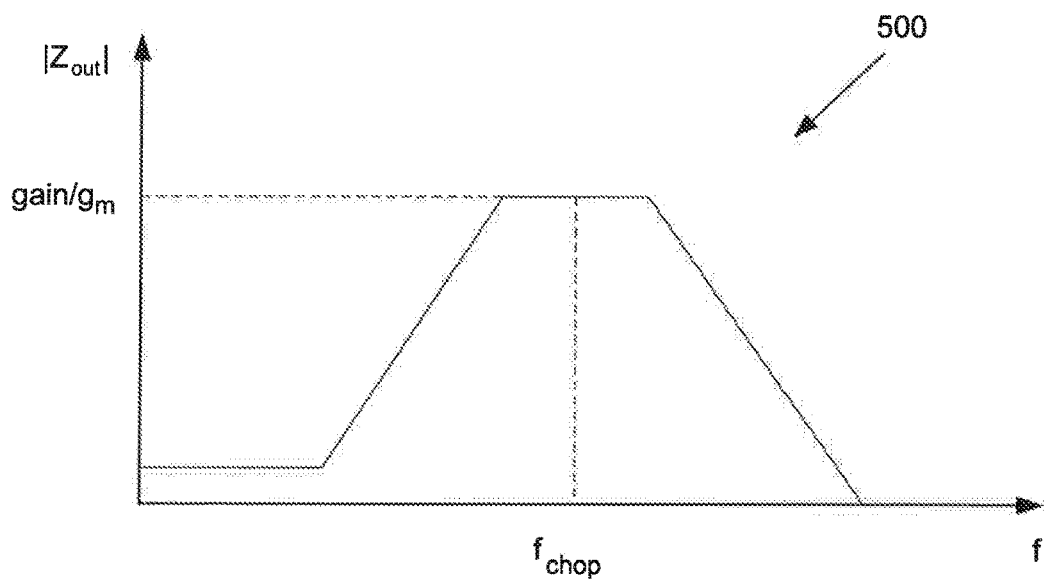
FIG. 5 shows a plot illustrating the filtering behaviour of part of the amplification stage shown in FIG. 4.

FIG. 5 shows a plot 500 illustrating the behaviour of either one of the negative feedback amplifiers 402, 404 as a function of frequency, f. In particular plot 500 shows a plot of the magnitude of the output impedance presented by a one of the negative feedback amplifiers, $|Z_{out}|$, as a function of frequency, f, from DC up to higher frequencies. As can be seen at lower frequencies, the output impedance is low and the gain of the overall amplification stage 400 is low. At higher frequencies either side of the chopper frequency, $f_{chop}$, the output impedance increases and is highest, and the gain has a maximum value, over a band of frequencies centred on $f_{chop}$. At highest frequencies, the output impedance and gain reduce again. Hence, the desired band-pass amplifier behaviour can be provided.

In FIG. 5, $g_m$ is the differential transconductance (i.e. voltage-to-current conversion factor) of transistors 308 and 314. The gain of the amplification stage 400 as a whole is the product of this transconductance and the output impedance of the negative feedback amplifiers. If the negative feedback amplifiers 402 and 404 have a differential output impedance $Z_{out}$ equal to gain/$g_m$, which they have at $f_{chop}$, then the gain of the amplification stage at $f_{chop}$ will be $g_m*(gain/g_m)$ gain. In other words, the negative feedback amplifiers 402, 404 are configured to have an output impedance that is related to the transconductance of transistors 308 and 314.

Figure 6:
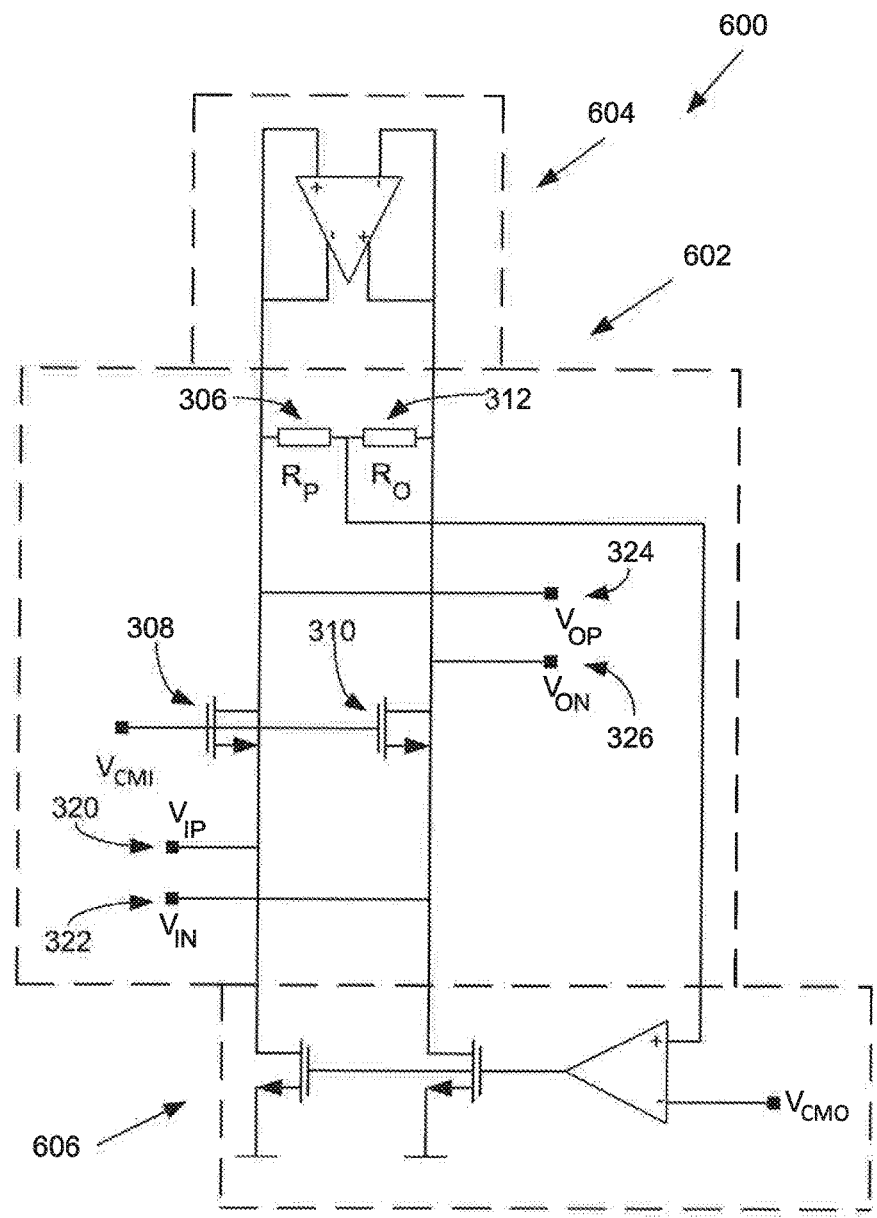
FIG. 6 shows a circuit diagram of a third example amplification stage which may be used in the chopper system shown in FIG. 2.

FIG. 6 shows a circuit diagram of a third band-pass amplifier circuit 600 corresponding generally to amplification stage 220 of FIG. 2. The band-pass amplifier circuit 600 includes a main amplifier 602, a differential amplifier 604 and a common mode amplifier 606, distinguished by dashed lines. The components and overall layout of the main amplifier 602 are generally similar to those of amplifier circuit 300. In the circuit 600 illustrated in FIG. 6, the pair of negative feedback amplifiers between output nodes of circuit 400, have been replaced by a differential input, differential output loop amplifier 604. This differential amplifier 604 mimics the desired inductive behaviour to provide the band-pass characteristic of the overall amplifier 600. The differential amplifier 604 improves the common-mode rejection performance and the power supply rejection performance of the third band-pass amplifier 600 compared to the second 400 and first 300 band-pass amplifiers. The differential amplifier 604 is configured to define the impedance at the output node of the main amplifier 600 and thereby the transfer characteristic. The common mode loop amplifier 606 is configured to define the common mode output voltage of the overall band-pass amplifier that appears at nodes $V_{OP}$ and $V_{ON}$.

In some embodiments, the chopper amplifier circuit 210, 300, 400, 600, and any output filter 230, may be provided as a package including a lead frame and die comprising a semi-conductor integrated circuit. The semi-conductor integrated circuit may be configured to provide the chopper amplifier circuit, and any output filter 230, as illustrated in FIGS. 2, 3, 4 and 6.

As noted above, although the chopper amplifier 210 and chopper amplifier system 200 have been described as applied to mobile phones, and in particular as a microphone amplifier, the chopper amplifier and chopper amplifier system are applicable to a wide variety of electronic devices and portable electronic devices.

In other applications, the chopper amplifier and/or chopper amplifier system may be used with one or more sensors or other transducer. By way of non-limiting example, it may be used with magnetic sensors, and particularly magnetic sensors of automotive parts and systems Indeed, the chopper amplifier and chopper amplifier system may be useful in any application where the signal levels are relatively low. The chopper amplifier and/or chopper amplifier system may be used with signals in the range of approximately microvolts to tens of millivolts, for example 10 μV to 10 mV, but is not limited in application to that specific range.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Any instructions and/or flowchart steps can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

The invention claimed is:

1. A chopper amplifier, comprising:
a first chopper arranged to modulate an input signal using a first chopper signal having a chopper frequency and to output a chopped signal;
an amplification stage having an input configured to receive the chopped signal and an output,
wherein the amplification stage is configured to supply an amplified signal at the output; and
an output chopper configured to integrate the amplified signal using a second chopper signal having the chopper frequency to generate an amplified output signal,
wherein the amplification stage is further configured to filter the signal passing through the amplification stage to attenuate signal components having frequencies lower than the chopper frequency;

wherein the amplification stage includes a main amplifier and a filter attached to an input of the main amplifier or a filter attached to an output of the main amplifier; and wherein the main amplifier comprises a cascade of a voltage-to-current converter and a current-to-voltage converter.

2. The chopper amplifier as claimed in claim 1,
wherein the amplification stage has a high pass filter behavior.

3. The chopper amplifier as claimed in claim 1,
wherein the amplification stage has a band pass filter behavior.

4. The chopper amplifier as claimed in claim 1,
wherein the main amplifier has a differential voltage input and a differential voltage output, and
wherein an inductive circuit or component is connected across the differential voltage output.

5. The chopper amplifier as claimed in claim 1, wherein
the voltage-to-current converter is provided by a pair of transistors having a common gate topology, and
the current-to-voltage converter is provided by a pair of resistors.

6. The chopper amplifier as claimed in claim 5,
wherein the inductive circuit is provided by a pair of negative feedback amplifiers.

7. The chopper amplifier as claimed in claim 1,
wherein the amplification stage further comprises a differential mode amplifier connected to the main amplifier and configured to govern a common mode rejection performance of the amplification stage.

8. The chopper amplifier as claimed in claim 1,
wherein the amplification stage further comprises a common mode amplifier connected to the main amplifier and configured to define the common mode output voltage of the main amplifier.

9. A chopper amplifier system, comprising:
the chopper amplifier as claimed in claim 1; and
a low pass filter configured to filter the amplified output signal generated by the second chopper.

10. A package including a semi-conductor integrated circuit,
wherein the semi-conductor integrated circuit is configured to provide the chopper amplifier of claim 1.

11. A portable electronic device, comprising:
the chopper amplifier system of claim 9; and
a loud speaker, and
wherein the chopper amplifier system is configured to receive the input signal from the loud speaker.

12. The portable electronic device as claimed in claim 11,
wherein the portable electronic device is a mobile phone and
wherein the mobile phone is configured to operate the loud speaker also as a microphone.

13. A chopper amplifier, comprising:
a first chopper arranged to modulate an input signal using a first chopper signal having a chopper frequency and to output a chopped signal;
an amplification stage having an input configured to receive the chopped signal and an output,
wherein the amplification stage is configured to supply an amplified signal at the output; and
an output chopper configured to integrate the amplified signal using a second chopper signal having the chopper frequency to generate an amplified output signal,
wherein the amplification stage is further configured to filter the signal passing through the amplification stage to attenuate signal components having frequencies lower than the chopper frequency;
wherein the amplification stage includes a main amplifier and a filter attached to an input of the main amplifier or a filter attached to an output of the main amplifier; and
wherein the amplification stage further comprises a differential mode amplifier connected to the main amplifier and configured to govern a common mode rejection performance of the amplification stage.

14. A chopper amplifier, comprising:
a first chopper arranged to modulate an input signal using a first chopper signal having a chopper frequency and to output a chopped signal;
an amplification stage having an input configured to receive the chopped signal and an output,
wherein the amplification stage is configured to supply an amplified signal at the output; and
an output chopper configured to integrate the amplified signal using a second chopper signal having the chopper frequency to generate an amplified output signal,
wherein the amplification stage is further configured to filter the signal passing through the amplification stage to attenuate signal components having frequencies lower than the chopper frequency;
wherein the amplification stage includes a main amplifier and a filter attached to an input of the main amplifier or a filter attached to an output of the main amplifier; and
wherein the amplification stage further comprises a common mode amplifier connected to the main amplifier and configured to define the common mode output voltage of the main amplifier.

\* \* \* \* \*